United States Patent
Feng et al.

(10) Patent No.: US 9,144,842 B2
(45) Date of Patent: Sep. 29, 2015

(54) UNIDIRECTIONAL SOLIDIFICATION PROCESS AND APPARATUS AND SINGLE-CRYSTAL SEED THEREFOR

(71) Applicants: Ganjiang Feng, Greenville, SC (US); Gregory Keith Bouse, Greer, SC (US); Kenneth Burrell Potter, Simpsonville, SC (US); Andrew John Elliott, Westminster, SC (US); Shan Liu, Central, SC (US)

(72) Inventors: Ganjiang Feng, Greenville, SC (US); Gregory Keith Bouse, Greer, SC (US); Kenneth Burrell Potter, Simpsonville, SC (US); Andrew John Elliott, Westminster, SC (US); Shan Liu, Central, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/851,075

(22) Filed: Mar. 26, 2013

(65) Prior Publication Data
US 2013/0206352 A1    Aug. 15, 2013

Related U.S. Application Data

(62) Division of application No. 12/970,104, filed on Dec. 16, 2010, now abandoned.

(51) Int. Cl.
*B22D 27/04* (2006.01)
*C30B 11/14* (2006.01)
*C30B 29/52* (2006.01)

(52) U.S. Cl.
CPC .............. *B22D 27/045* (2013.01); *C30B 11/14* (2013.01); *C30B 29/52* (2013.01)

(58) Field of Classification Search
CPC ....... B22D 27/045; C30B 11/00; C30B 11/14
USPC .......... 164/1, 47, 122–122.2, 338.1
See application file for complete search history.

(56) References Cited

U.S. PATENT DOCUMENTS

| | | | | |
|---|---|---|---|---|
| 5,275,228 | A | * | 1/1994 | Wortmann et al. ........ 164/122.2 |
| 5,304,039 | A | * | 4/1994 | Corderman et al. ...... 416/241 R |
| 6,197,108 | B1 | * | 3/2001 | Iino et al. ........................ 117/13 |
| 2003/0177975 | A1 | * | 9/2003 | Ikesue et al. ...................... 117/2 |
| 2005/0211408 | A1 | * | 9/2005 | Bullied et al. ............. 164/122.2 |
| 2007/0125299 | A1 | * | 6/2007 | D'Souza et al. ................ 117/81 |

FOREIGN PATENT DOCUMENTS

JP    10045499 A  *  2/1998

OTHER PUBLICATIONS

English translation of Otani et al. JP 10045499 A.*

* cited by examiner

*Primary Examiner* — Kevin P Kerns
*Assistant Examiner* — Steven Ha
(74) *Attorney, Agent, or Firm* — Ernest G. Cusick; Gary M. Hartman; Michael D. Winter

(57) ABSTRACT

A single-crystal seed, apparatus and process for producing a casting having a single-crystal (SX) microstructure. The seed has a geometry that includes a vertex capable of destabilizing an oxide film that forms at the interface between the seed and a molten metal during the casting process, and thereby promotes a continuous single-crystal grain growth and reduces grain misorientation defects that can initiate from the seed/metal interface.

18 Claims, 4 Drawing Sheets

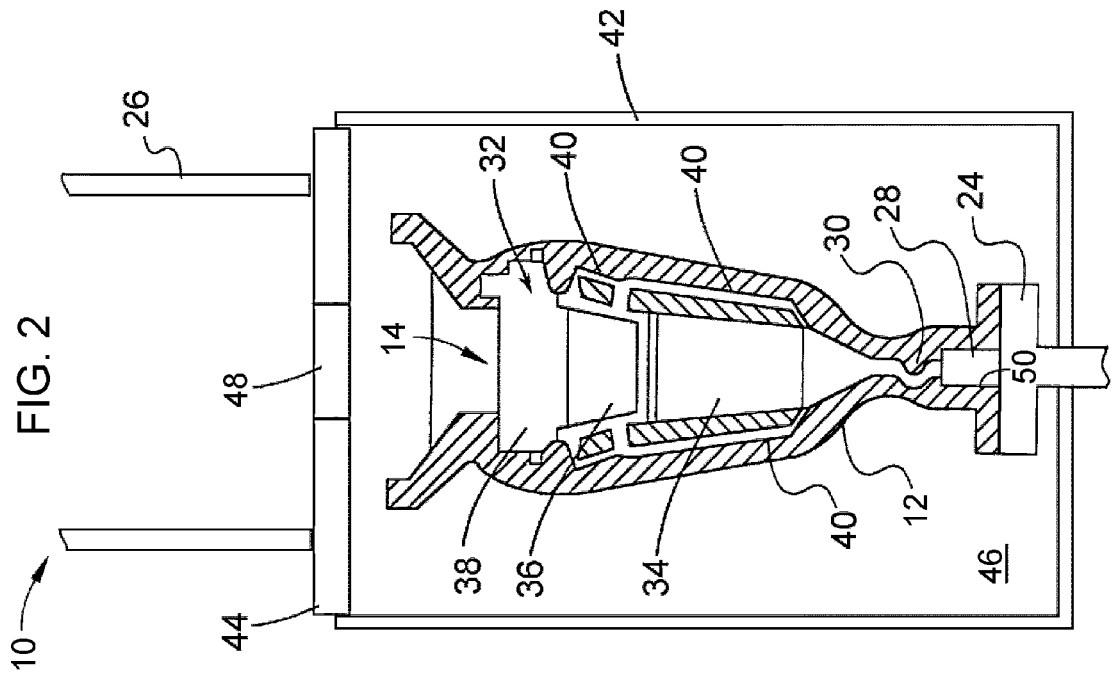
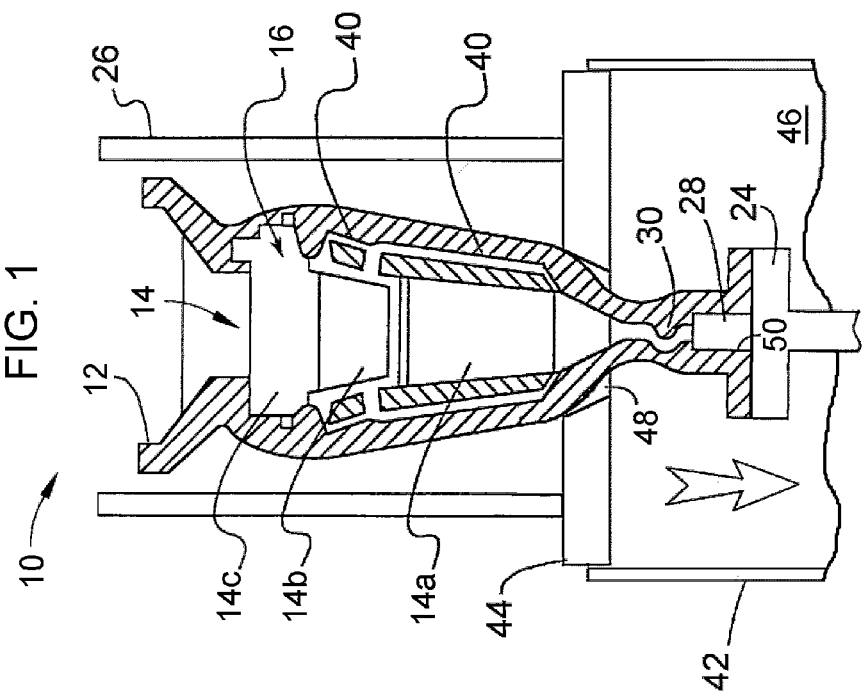

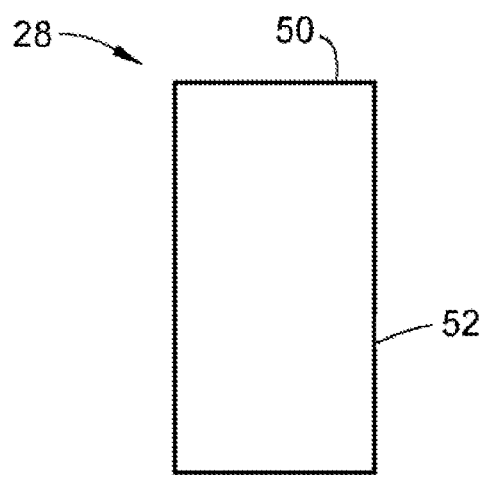
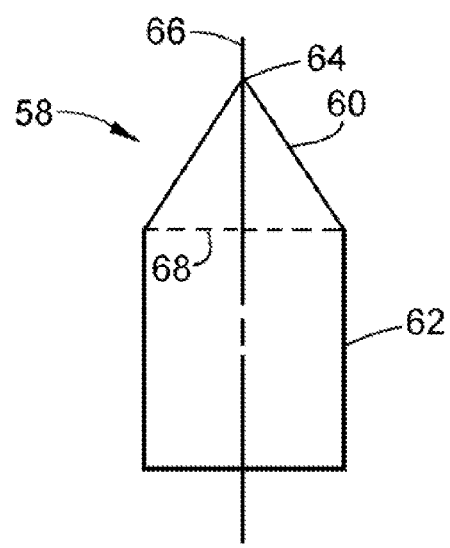
FIG. 3
(Prior Art)
FIG. 4
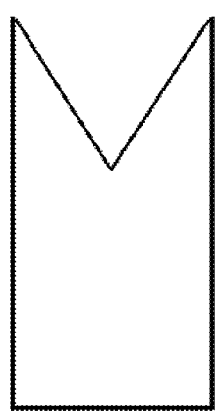
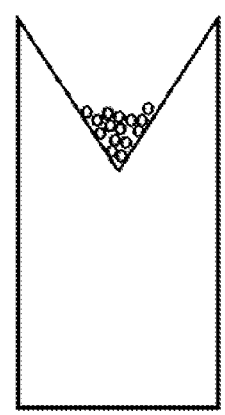
FIG. 5
FIG. 6

UNIDIRECTIONAL SOLIDIFICATION PROCESS AND APPARATUS AND SINGLE-CRYSTAL SEED THEREFOR

CROSS REFERENCE TO RELATED APPLICATIONS

This is a divisional patent application of co-pending U.S. patent application Ser. No. 12/970,104, filed Dec. 16, 2010, now abandoned.

BACKGROUND OF THE INVENTION

The present invention generally relates to materials and processes for producing directionally-solidified castings, and particularly to a process and apparatus capable of reducing defects in single-crystal (SX) castings, including but not limited to cast components of gas turbines and other high temperature applications.

Components of gas turbines, such as buckets (blades), nozzles (vanes) and combustor components, are typically formed of nickel, cobalt or iron-base superalloys characterized by desirable mechanical properties at turbine operating temperatures. Because the efficiency of a gas turbine is dependent on its operating temperatures, there is an ongoing effort to develop components, and particularly turbine buckets, nozzles, and combustor components, that are capable of withstanding higher temperatures. As the material requirements for gas turbine components have increased, various processing methods and alloying constituents have been used to enhance the mechanical, physical and environmental properties of components formed from superalloys. For example, buckets, nozzles and other components employed in demanding applications are often cast by unidirectional casting techniques to have directionally-solidified (DS) or single-crystal (SX) microstructures, characterized by an optimized crystal orientation along the crystal growth direction to produce columnar polycrystalline or single-crystal articles.

As known in the art, directional casting techniques for producing DS and SX castings generally entail pouring a melt of the desired alloy into an investment mold held at a temperature above the liquidus temperature of the alloy. One such process is represented in FIGS. 1 and 2 as an apparatus 10 that employs a Bridgman-type furnace to create a heating zone 26 surrounding a shell mold 12, and a cooling zone 42 beneath the mold 12. The zones 26 and 42 may be referred to as "hot" and "cold" zones, respectively, which denote their temperatures relative to the melting temperature of the alloy being solidified. The mold 12 has an internal cavity 14 corresponding to the desired shape of a casting 32 (FIG. 2), represented as a turbine bucket. As such, FIG. 1 represents the cavity 14 as having regions 14a, 14b and 14c that are configured to form, respectively, an airfoil portion 34, shank 36, and dovetail 38 (FIG. 2) of the casting 32. The cavity 14 may also contain cores (not shown) for the purpose of forming internal structures such as cooling passages within the casting 32.

The mold 12 is shown secured to a chill plate 24 and initially placed in the heating zone 26 (Bridgman furnace). The heating zone 26 heats the mold 12 to a temperature above the liquidus temperature of the alloy. The cooling zone 42 is directly beneath the heating zone 26, and operates to cool the mold 12 and the molten alloy 16 within by conduction, convection and/or radiation techniques. For example, the cooling zone 42 may be a tank containing a liquid cooling bath 46, such as a molten metal, or a radiation cooling tank that may be evacuated or contain a gas at ambient or cooled temperature. The cooling zone 42 may also employ gas impingement cooling or a fluidized bed.

An insulation zone 44 defined by a baffle, heat shield or other suitable means is between and separates the heating and cooling zones 26 and 42. The insulation zone 44 serves as a barrier to thermal radiation emitted by the heating zone 26, thereby promoting a steep axial thermal gradient between the mold 12 and the cooling bath 46. The insulation zone 44 has a variable-sized opening 48 that, as represented in FIG. 1, enables the insulation zone 44 to fit closely around the shape of the mold 12 as it is withdrawn from the heating zone 26, through the insulation zone 44, and into the liquid cooling bath 46.

Casting processes of the type represented in FIGS. 1 and 2 are typically carried out in a vacuum or an inert atmosphere. After the mold 12 is preheated to a temperature above the liquidus temperature of the alloy being cast, molten alloy 16 is poured into the mold 12 and the unidirectional solidification process is initiated by withdrawing the base of the mold 12 and chill plate 24 downwardly at a fixed withdrawal rate into the cooling zone 42, until the mold 12 is entirely within the cooling zone 42 as represented in FIG. 2. The insulation zone 44 is required to maintain the high thermal gradient at the solidification front to prevent nucleation of new grains during the directional solidification processes. The temperature of the chill plate 24 is preferably maintained at or near the temperature of the cooling zone 42, such that dendritic growth begins at the lower end of the mold 12 and the solidification front travels upward through the mold 12.

FIGS. 1 and 2 represent a single-crystal seed 28 within a cavity 50 at the bottom of the mold 12. The casting 32 epitaxially grows from the seed 28, such that both the primary and secondary crystal orientations are controlled to yield a single-crystal casting. The seed 28 represented in FIGS. 1 and 2 has a cylindrical shape, which is conventional for directional casting techniques, though other shapes are known. FIGS. 1 and 2 further represent a crystal selector 30 coupling the seed cavity 50 to the mold cavity 14, which ensures that a single crystal enters the cavity 14. A bridge 40 connects protruding sections of the casting 32 with lower sections of the casting 32 so that crystal nucleation at these protruding locations can be suppressed and a unidirectional columnar single crystal forms substantially throughout the casting 32.

Mechanical properties of DS and SX castings depend, to a large degree, on the avoidance of grain misorientation defects, for example, high-angle grain boundaries, equiaxed grains, and other potential defects that may occur as a result of the directional solidification process. The avoidance of such defects in a SX casting depends primarily on whether the crystal orientation of the seed 28 can be successfully extended into the casting 32. For this purpose, the seed 28 must be properly oriented at the bottom of the mold 12. In an ideal situation, when the molten alloy 16 is poured into the mold 12 and makes contact with the seed 28, a portion of the single-crystal seed 28 is re-melted. Then, as the mold 12 is slowly withdrawn from the hot zone 26, continuous epitaxial grain growth occurs to yield a single crystal article with an orientation dictated by the single-crystal seed 28.

Although casting processes of the type represented in FIGS. 1 and 2 are typically carried out in vacuum, a thin oxide film can form at the interface between the molten alloy 16 and the single-crystal seed 28 if the alloy and/or seed 28 contains elements capable of chemically reacting with residual oxygen in the vacuum chamber. It is understood that this oxide film is ceramic in nature and can prohibit continuous grain growth from the seed 28, generate misoriented grains, and cause defects in the final casting 32. The formation of an oxide film at the seed-alloy interface can be inhibited by reducing the availability of oxygen and reactive elements within the alloy. However, most nickel-base superalloys used to form single-crystal castings rely on the presence of aluminum to form $Ni_3Al$ (gamma prime) as the primary strengthening phase for alloys used to form articles subjected to high stresses in high temperature environments. For example, René N5 (U.S. Pat. No. 6,074,602) contains about 5 to about 7 weight percent aluminum, and CMSX-10 has a nominal aluminum content of about 5.7 weight percent. The oxide films that form during directional solidification of these alloys have been found to typically be aluminum oxide ($Al_2O_3$) mixed with chromium oxide ($Cr_2O_3$), nickel monoxide (NiO) and titanium oxide ($Ti_2O_3$). Due to the high reactivity of aluminum with oxygen, $Al_2O_3$ can form at partial pressures of oxygen being as low as $10^{-18}$ at a pouring temperature of about 1500° C., which is equivalent to a vacuum of $10^{-6}$ torr if water is assumed to be the only residual gas. However, the vacuum in a Bridgman system is typically not better than $10^{-3}$ torr. Furthermore, oxygen may be present as an impurity in the molten alloy 16 and/or seed 28, can be present in the mold 12, and can also form as a result of reactions between the mold 12 and the molten alloy 16.

Aside from excluding aluminum from the alloy being cast, attempts to inhibit the formation of an oxide film at the seed-alloy interface have included excluding aluminum from the seed, as reported in U.S. Pat. No. 6,740,176 and U.S. Published Patent Application No. 2010/0058977. However, if aluminum is a required constituent of the seed and/or the casting alloy, it is very difficult to prevent the formation of an oxide film at the seed-alloy interface.

BRIEF DESCRIPTION OF THE INVENTION

The present invention provides a process of casting an alloy using a unidirectional casting technique to produce a casting having a single-crystal (SX) microstructure. The invention further provides a single-crystal seed whose geometry is able to automatically destabilize an oxide film that attempts to form at the interface between the seed and the molten metal during the mold filling process, and thereby promotes a continuous single-crystal grain growth and reduces and preferably eliminates grain misorientation defects that would otherwise initiate from the oxide film at the seed/metal interface.

According to a first aspect of the invention, a process of unidirectionally casting an alloy includes providing a mold having a base and a mold cavity adjacent thereto, placing a single-crystal seed in the base of the mold, and introducing a molten quantity of the alloy into the mold cavity. The seed includes a body having a single-crystal microstructure and at least a first surface region, and the first surface region defines a vertex of the body that protrudes away from the body. The mold is then cooled to cause unidirectional solidification of the molten quantity of the alloy within the mold and produce a unidirectionally-solidified casting having a columnar crystal structure. The molten quantity of the alloy contacts the seed so that the molten quantity epitaxially solidifies based on a crystallographic orientation of the seed. The vertex of the body of the seed destabilizes an oxide film forming on the first surface region as a result of surface tension of the oxide film at the vertex being sufficiently high to cause the oxide film to collapse as the oxide film is forming on the first surface region.

According to a second aspect of the invention, a process of unidirectionally casting an alloy includes providing a mold having a base and a mold cavity adjacent thereto, placing a single-crystal seed in the base of the mold, and introducing a molten quantity of the alloy into the mold cavity. The seed includes a body having at least a first surface region and having a single-crystal microstructure with a crystallographic orientation. The seed is disposed in the base of the mold with the first surface region facing upward into the mold cavity therein, and the first surface region defines a vertex of the body that protrudes away from the body. The mold is then cooled to cause unidirectional solidification of the molten quantity of the alloy within the mold and produce a unidirectionally-solidified casting having a columnar crystal structure. The molten quantity of the alloy contacts the seed so that the molten quantity epitaxially solidifies based on the crystallographic orientation of the seed. The vertex of the body of the seed destabilizes an oxide film attempting to form on the first surface region as a result of surface tension of the oxide film at the vertex being sufficiently high to cause the oxide film to collapse as the oxide film is forming on the first surface region and thereby cause the oxide film to collapse under surface tension on a remainder of the first surface region below the vertex.

According to another aspect of the invention, a casting apparatus is provided that utilizes a single-crystal seed to unidirectionally cast an alloy. The apparatus has a mold having a base and a mold cavity adjacent thereto. The mold cavity is adapted to contain a molten quantity of the alloy during solidification thereof to yield a unidirectionally-solidified casting defined by the mold cavity. A heating zone is provided to heat the mold and the molten quantity of the alloy therein to a heating temperature above the liquidus temperature of the alloy. A cooling zone is provided to cool the mold and the molten quantity of the alloy therein to a cooling temperature below the solidus temperature of the alloy to cause unidirectional solidification of the molten quantity of the alloy and thereby yield the unidirectionally-solidified casting. The single-crystal seed is disposed in the base of the mold and is coupled to the mold cavity so that the molten quantity of the alloy epitaxially solidifies based on a crystallographic orientation of the seed. The seed includes a body having at least a first surface region that defines a vertex of the body that protrudes away from the body. The vertex is adapted to destabilize an oxide film attempting to form on the first surface region when the first surface region is contacted by a molten metal. The vertex destabilizes the oxide film as a result of surface tension of the oxide film at the vertex being sufficiently high to cause the oxide film to collapse as the oxide film is forming on the first surface region during the casting process.

A technical effect of the invention is the ability to promote the mechanical properties of a casting, and particularly single-crystal castings, that depend primarily on the avoidance of potential defects that can occur during a unidirectional solidification process due to the formation of an oxide film at the interface between the molten metal and a single-crystal seed used to initiate the epitaxial growth required to produce a directionally solidified casting. In particular, a preferred aspect of the invention is that the seed has a geometry capable of destabilizing the oxide film to the extent that the film tends to collapse and does not interfere with the epitaxial grain growth from the seed during the casting process. Consequently, the seed is able to reduce grain misorientation defects that tend to initiate from the seed/metal interface and therefore can improve the yield of single-crystal castings produced by the process.

Other aspects and advantages of this invention will be better appreciated from the following detailed description.

BRIEF DESCRIPTION OF THE DRAWINGS

FIGS. 1 and 2 represent sectional views showing two steps of a unidirectional casting (solidification) process to produce a single-crystal turbine blade.

FIG. 3 schematically represents a single-crystal seed conventionally used in unidirectional casting processes in accordance with the prior art.

FIG. 4 schematically represents a single-crystal seed suitable for use in a unidirectional casting process in accordance with an embodiment of this invention.

FIGS. 5 and 6 schematically represent single-crystal seeds evaluated during investigations leading to the present invention.

DETAILED DESCRIPTION OF THE INVENTION

Figure 7:
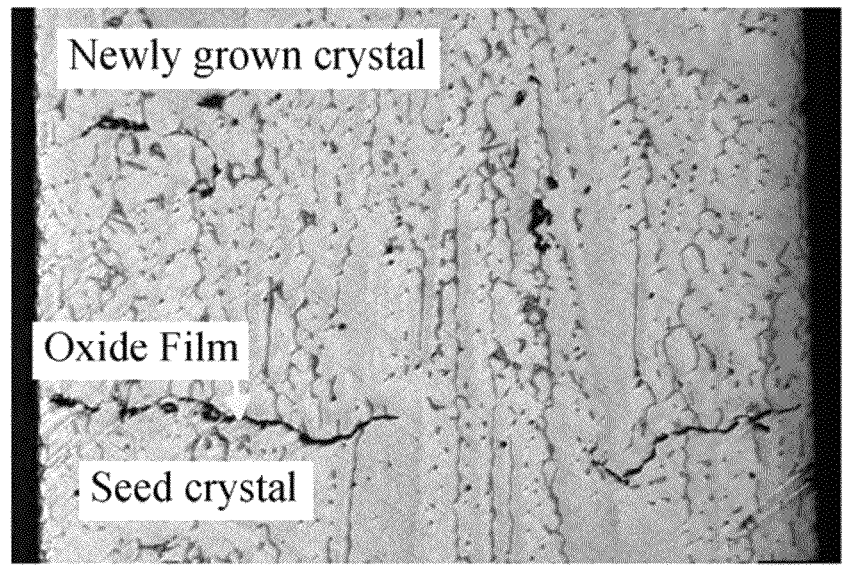
FIGS. 7 through 10 are microphotographs showing in cross-section four castings produced using the seeds of FIGS. 3 through 6, respectively.
Figure 8:
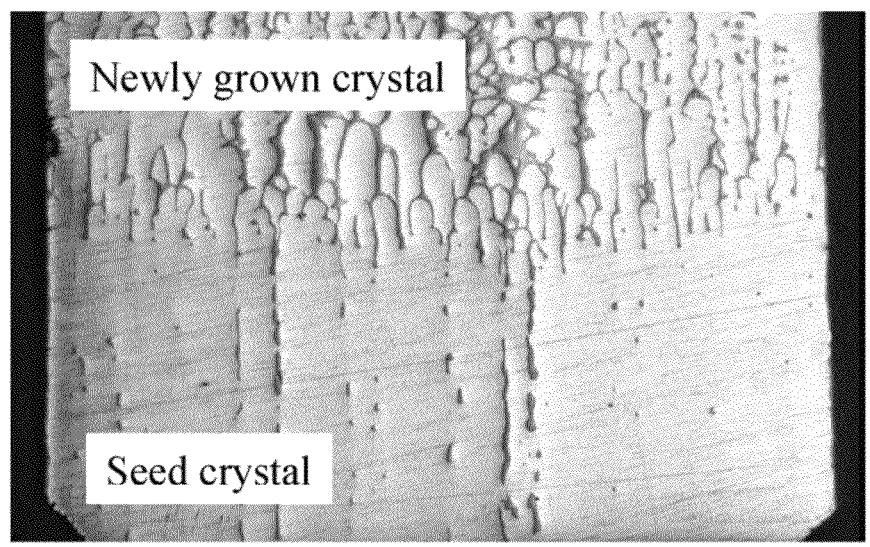
Figure 9:
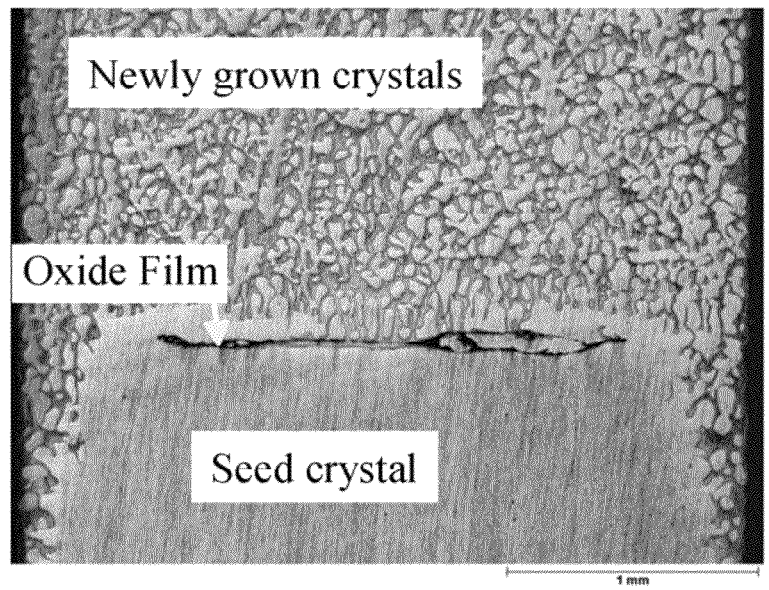
Figure 10:
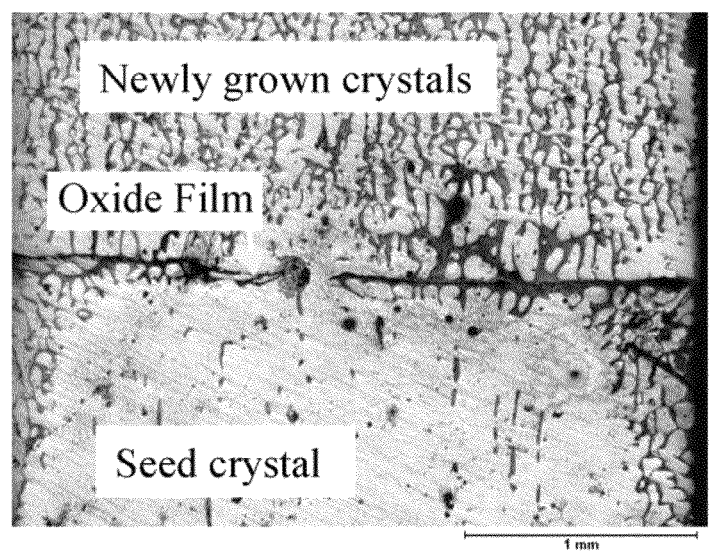

The present invention can be employed to produce various castings from a wide variety of alloys, including but not limited to nickel-base, cobalt-base and iron-base superalloy. Certain capabilities of the invention are particularly well suited for producing castings having a columnar single-crystal microstructure (SX). In some cases, a preferred single-crystal direction is <001>, though crystalline structures having orientations other than <001> are also within the scope of the invention. The capabilities of the invention are also particularly well suited for producing castings from alloys that contain levels of reactive elements above incidental or trace amounts that may otherwise be present. Most notably, an alloy may contain aluminum at a level of 0.5 weight percent or more, which renders the alloy reactive to oxygen in the casting environment, including the surrounding atmosphere as well as any oxygen that might be available in the alloy being cast and the mold and cores used to cast the alloy. Other reactive elements of potential concern include titanium, yttrium and rare-earth elements. In addition to aluminum, these elements are commonly found in alloys used to produce cast articles suitable for such applications as the hot gas flow path components of a gas turbine, including but not limited to buckets and nozzles of land-based gas turbines, blades and vanes of aircraft gas turbines, as well as shrouds found in both types of gas turbines. While the advantages of this invention will be described with reference to SX components of a gas turbine, the teachings of this invention can be applicable to other components that may benefit from being unidirectionally cast.

A SX casting can be produced with the present invention from a melt of the desired alloy, for example, prepared by known vacuum induction melting techniques. The melt is then cast in a mold, in particular an investment mold such as the shell mold 12 used with the apparatus 10 represented in FIGS. 1 and 2. As such, the previous discussion of the apparatus 10 can also be applied to the discussion of the present invention though, as discussed below, with at least one notable exception being the single-crystal seed 28 represented in FIGS. 1 and 2. The present invention proposes modifications to the seed 28 that are capable of promoting the metallurgical and mechanical properties of the casting 32 beyond what can ordinarily be achieved with conventional unidirectional casting techniques. The invention does not necessarily restrict or otherwise modify other aspects of the apparatus 10. For example, the mold 12 may be formed of conventional mold materials such as alumina or silica, and cores may be positioned within the mold cavity 14 to form internal passages/features in the casting. Furthermore, liquid metal can be introduced into the mold cavity 14 through a gating system (not shown), and a riser (not shown) may be used to feed the solidification shrinkage of the casting. As such, the following discussion will refer to the apparatus 10 described in reference to FIGS. 1 and 2, and aspects of the casting process and apparatus 10 not discussed in any detail below can be, in terms of structure, function, materials, etc., essentially as was described in reference to FIGS. 1 and 2.

As noted above, the present invention is primarily directed to the use of a single-crystal seed that differs from the cylindrical-shaped seed 28 represented in FIGS. 1 and 2. The conventional seed 28 is schematically represented in isolation in FIG. 3. The seed 28 has a planar circular-shaped upper surface region 50 and a cylindrical lower surface region 52. As evident from FIGS. 1 and 2, the molten alloy 16 poured into the mold cavity 14 comes in contact with the upper surface region 52 of the seed 28, causing the seed 28 to melt at this surface region 52 and initiate epitaxial growth that is consistent with the orientation of the single-crystal seed 28 as the mold 12 is slowly withdrawn from the hot zone 26 of the apparatus 10. In this manner, the seed 28 controls both the primary and secondary crystal orientations of the casting 32 characteristic of a single-crystal casting.

FIG. 4 schematically represents a single-crystal seed 58 in accordance with an embodiment of the present invention. The seed 58 can be seen to be in the form of a body having an upper surface region 60 with a protruding conical shape and, similar to the seed 28 of FIG. 3, a lower surface region 62 having a cylindrical shape. The body of the seed 58 is represented as being unitary, though it is foreseeable that lower portions of the seed 58 could differ in shape and composition from the remainder of the seed 58, and particularly its conical-shaped upper surface region 60. As a result of its conical shape, the upper surface region 60 defines a vertex (apex) 64 of the body that extends or protrudes away from the remainder of the body, including the cylindrical surface region 62 of the body. When placed in the seed cavity 50, the vertex 64 faces the mold cavity 12 such that the molten alloy 16 placed in the cavity 14 first comes into contact with the upper surface region 60, causing initial melting of the seed 58 to occur at the upper surface region 60 and initiate epitaxial growth that results in the single-crystal casting 32. Notably, whereas the epitaxial growth direction is normal to the flat upper surface region 50 of the conventional seed 28 of FIG. 3, the epitaxial growth direction is not normal to any part of the conical-shaped upper surface region 60 of the seed 58 of FIG. 5.

According to a preferred aspect of the invention, the vertex 64 of the upper surface region 60 is capable of destabilizing an oxide film that attempts or begins to form on the interface defined by and between the seed 58 and the molten alloy 16. Due to a very large surface tension believed to be present at the vertex 64 of the seed 58, any oxide film that begins to form on the surface region 60 tends to collapse at the vertex 64, with the result that any oxide film that has formed on the remainder of the surface region 60 will collapse under surface tension. In contrast, an oxide film is able to remain stable as it forms on the flat upper surface region 50 of the conventional seed 28 of FIG. 3.

Due to its conical shape, the upper surface region 60 of the seed 58 is a surface of revolution formed by rotating a segment of a first line around a second line that intersects the first line. In geometric terms, the upper surface region 60 can be described as a lateral surface of the conical portion of the seed

58. The upper surface region 60 is represented in FIG. 4 as a right circular cone, in that an axis 66 that passes through the vertex 64 (and therefore about which the upper surface region 60 has rotational symmetry, and more particularly axial symmetry) also passes through the center of the base 68 of the cone at a right angle, and the base 68 is a circle. However, it is foreseeable that the upper surface region 60 could have other conical shapes, such as an oblique cone in which the axis 66 does not pass perpendicularly through the center of the base 68. Furthermore, the base 68 is not required to be circular, but may have any shape, including rectilinear. The upper surface region 60 is preferably disposed at an angle of about 20 to about 40 degrees from the axis 66, though lesser and greater angles are foreseeable. In addition, the height of the conical shaped defined by the upper surface region 60 (as defined by the distance between the vertex 64 and the base 68) can vary depending on the size of the seed 58 and the particular application in which the seed 58 is to be used, though a suitable height is believed to be in a range of about 0.5 to about 1.5 centimeters.

Preferred crystallographic orientations for the seed 58 will depend on the particular application, though for producing single-crystal castings it may be preferred that the <001> crystal axis of the seed 58 is oriented parallel to the axis 66. Similarly, preferred materials for the seed 58 will depend on the particular application, including the particular alloy being cast. Generally, the predominant constituent of the casting alloy will also be the predominant constituent of the seed, for example, the seed 58 will have a nickel-base alloy composition when casting a nickel-base alloy. Notably, the effectiveness of the vertex 64 to destabilize the formation of an oxide film allows for the seed 58 to be formed of an alloy that contains one or more reactive elements, such as aluminum, titanium, yttrium, rare-earth metals, and other potentially reactive elements that would otherwise be of concern to form an oxide film.

As with the apparatus 10 and process described in reference to FIGS. 1 and 2, casting processes performed with the seed 58 of FIG. 4 are preferably carried out in a vacuum or an inert atmosphere. The mold 12 is preheated prior to introducing the melt of the desired alloy, preferably to a temperature equal to or above the melting temperature of the alloy, and more particularly above the liquidus temperature of the alloy, after which unidirectional solidification is initiated by withdrawing the chill plate 24 and the base of the mold 12 downwardly at a fixed rate through the insulation zone 44 where solidification is initiated, and then into the cooling zone 42 where solidification is completed. The cooling zone 42 may contain a liquid metal cooling bath 46, or a vacuum or ambient or cooled air for radiation cooling. Depending on particular conditions, a single unidirectional columnar crystal (SX) forms substantially throughout the casting 32. For example, the seed 58 can be oriented with the seed cavity 50 so that epitaxial growth occurs with the <100> orientation. From the above, it should be appreciated that the overall sequence of the unidirectional solidification process performed with the seed 58 can be similar to unidirectional solidification processes performed with other traditional Bridgman furnaces.

In investigations leading to the present invention, a melt of an aluminum alloy containing about 5 weight percent copper was prepared, along with single-crystal seeds configured according to the conventional cylindrical seed 28 of FIG. 3, the seed 58 of FIG. 4, and two additional seeds whose geometries are schematically represented in FIGS. 5 and 6. Each seed was formed of essentially the same Al—Cu alloy as the melt. Each of the seeds represented in FIGS. 5 and 6 has an outer cylindrical shape and an inward conical recess defined in its upper surface, and is therefore essentially the inverse of the outward conical protrusion of the seed 58 represented in FIG. 4. The seed of FIG. 6 differed from that of FIG. 5 by including a small amount of silica ($SiO_2$) powder in its conical recess. Each of the four seeds had a total height of about 2.0 centimeters from top to bottom, and the cylindrical surface region of each seed had a diameter of about 0.6 centimeter. The height of the conical shape of the upper surface region 60 of the seed 58 was about 0.5 centimeter, and the upper surface region 60 was disposed at an angle of about 30 degrees to the axis 66 of the seed 58. The depth of the conical shape of each recessed surface region of the seeds shown in FIGS. 5 and 6 was about 0.5 centimeter, and the recessed surface regions were disposed at an angle of about 30 degrees to the axes of the seeds.

All four seeds were employed in the same or otherwise identical molding apparatus, and roughly the same amounts of the Al—Cu alloy were unidirectionally solidified using essentially identical processes, including the same growth velocity and temperature gradient. Sections of castings produced with the seeds of FIGS. 3 through 6 are shown in FIGS. 7 through 10, respectively. In FIG. 7, corresponding to the conventional cylindrical-shaped seed 28 of FIG. 3, an oxide film can be clearly seen at the interface between the cast Al—Cu alloy and the remainder of the seed 28 (following partial melting of its upper surface region 50). An oxide film can be similarly seen at the same interface for the Al—Cu alloy castings produced with the seeds of FIGS. 5 and 6. In contrast, no oxide film is evident at the interface (or elsewhere) for the Al—Cu alloy casting produced with the seed 58 of FIG. 4. From these results, it was concluded that a seed having an upper surface region that defines a vertex is capable of preventing the formation of an oxide film through some mechanism by which the oxide film breaks and/or collapses as it attempts to form. As such, the seed and its vertex have the ability to reduce grain misorientation defects that can initiate from the seed/metal interface.

While the invention has been described in terms of specific embodiments, it is apparent that other forms could be adopted by one skilled in the art. For example, the physical configuration of the seed 58, the apparatus 10, and castings formed therewith could differ from those shown, and the seed 58 could be used in a casting process that differs from what was described above in reference to the apparatus 10. Therefore, the scope of the invention is to be limited only by the following claims.

The invention claimed is:

1. A process of unidirectionally casting an alloy, the process comprising:

providing a mold having a base and a mold cavity adjacent thereto;

placing a single-crystal seed in the base of the mold, the seed comprising a body having a single-crystal microstructure and at least a first surface region, the first surface region defining a vertex of the body that protrudes away from the body;

introducing a molten quantity of the alloy into the mold cavity; and then cooling the mold to cause unidirectional solidification of the molten quantity of the alloy within the mold and produce a unidirectionally-solidified casting having a columnar crystal structure, the molten quantity of the alloy contacting the seed so that the molten quantity epitaxially solidifies based on a crystallographic orientation of the seed, the vertex of the body of the seed destabilizing an oxide film forming on the first surface region as a result of surface tension of the oxide film at the vertex being sufficiently high to cause the oxide film to collapse as the oxide film is forming on the first surface region;

wherein the first surface region of the body is a lateral surface of a conical portion of the body and the vertex is a point of the conical portion.

2. The process according to claim 1, wherein the body of the seed has an axis that passes through the vertex and about which the first surface region has axial symmetry.

3. The process according to claim 1, wherein the conical portion of the body has an axis that passes through the vertex and about which the first surface region has a rotational symmetry, and the first surface region is at an angle of about 20 to about 40 degrees to the axis.

4. The process according to claim 1, wherein the body of the seed has an axis that passes through the vertex and the crystallographic orientation is oriented parallel to the axis.

5. The process according to claim 1, wherein the body of the seed is formed of a seed alloy containing at least one reactive element chosen from the group consisting of aluminum, titanium, yttrium, and rare-earth metals.

6. The process according to claim 1, wherein the alloy is a nickel-base, cobalt-base or iron-base superalloy that contains at least one reactive element chosen from the group consisting of aluminum, titanium, yttrium, and rare-earth metals.

7. The process according to claim 1, wherein the unidirectionally-solidified casting is a component of a gas turbine.

8. The process according to claim 1, wherein the seed is disposed in the base of the mold and the first surface region faces upward into the mold cavity.

9. A process of unidirectionally casting an alloy, the process comprising:

providing a mold having a base and a mold cavity adjacent thereto;

placing a single-crystal seed in the base of the mold, the seed comprising a body having at least a first surface region and having a single-crystal microstructure with a crystallographic orientation, the seed being disposed in the base of the mold with the first surface region facing upward into the mold cavity therein, the first surface region defining a vertex of the body that protrudes away from the body;

introducing a molten quantity of the alloy into the mold cavity; and then cooling the mold to cause unidirectional solidification of the molten quantity of the alloy within the mold and produce a unidirectionally-solidified casting having a columnar crystal structure, the molten quantity of the alloy contacting the seed so that the molten quantity epitaxially solidifies based on the crystallographic orientation of the seed, the vertex of the body of the seed destabilizing an oxide film attempting to form on the first surface region as a result of surface tension of the oxide film at the vertex being sufficiently high to cause the oxide film to collapse as the oxide film is forming on the first surface region and thereby cause the oxide film to collapse under surface tension on a remainder of the first surface region below the vertex;

wherein the first surface region of the body is a lateral surface of a conical portion of the body and the vertex is a point of the conical portion.

10. The process according to claim 9, wherein the body of the seed has an axis that passes through the vertex and about which the first surface region has axial symmetry.

11. The process according to claim 9, wherein the conical portion of the body has an axis that passes through the vertex and about which the first surface region has a rotational symmetry, and the first surface region is at an angle of about 20 to about 40 degrees to the axis.

12. The process according to claim 9, wherein the body of the seed has an axis that passes through the vertex and the crystallographic orientation of the seed is oriented parallel to the axis.

13. The process according to claim 9, wherein the body of the seed is formed of a seed alloy containing at least one reactive element chosen from the group consisting of aluminum, titanium, yttrium, and rare-earth metals.

14. The process according to claim 9, wherein the body of the seed has an axis that passes through the vertex, the crystallographic orientation of the seed is oriented parallel to the axis, and the first surface region is at an angle of about 20 to about 40 degrees to the axis.

15. An apparatus for unidirectionally casting an alloy, the apparatus comprising:

a mold having a base and a mold cavity adjacent thereto, the mold cavity being adapted to contain a molten quantity of the alloy during solidification thereof to yield a unidirectionally-solidified casting defined by the mold cavity;

a heating zone adapted to heat the mold and the molten quantity of the alloy therein to a heating temperature above the liquidus temperature of the alloy;

a cooling zone adapted to cool the mold and the molten quantity of the alloy therein to a cooling temperature below the solidus temperature of the alloy to cause unidirectional solidification of the molten quantity of the alloy and thereby yield the unidirectionally-solidified casting; and a single-crystal seed disposed in the base of the mold and coupled to the mold cavity so that the molten quantity of the alloy epitaxially solidifies based on a crystallographic orientation of the seed, the seed comprising a body having at least a first surface region, the first surface region defining a vertex of the body that protrudes away from the body, the vertex being adapted to destabilize an oxide film attempting to form on the first surface region when the first surface region is contacted by a molten metal during a mold filling step of the casting process, the vertex destabilizing the oxide film as a result of surface tension of the oxide film at the vertex being sufficiently high to cause the oxide film to collapse as the oxide film is forming on the first surface region during the casting process;

wherein the first surface region of the body is a lateral surface of a conical portion of the body and the vertex is a point of the conical portion.

16. The apparatus according to claim 15, wherein the body of the seed has an axis that passes through the vertex and about which the first surface region has axial symmetry.

17. The apparatus according to claim 15, wherein the conical portion of the body has an axis that passes through the vertex and about which the first surface region has a rotational symmetry, and the first surface region is at an angle of about 20 to about 40 degrees to the axis.

18. The apparatus according to claim 16, wherein the body of the seed is formed of a seed alloy containing at least one reactive element chosen from the group consisting of aluminum, titanium, yttrium, and rare-earth metals.

* * * * *